United States Patent [19]

Chow

[11] Patent Number: 4,571,538
[45] Date of Patent: Feb. 18, 1986

[54] MASK ALIGNMENT MEASUREMENT STRUCTURE FOR SEMICONDUCTOR FABRICATION

[75] Inventor: Pei-Ming D. Chow, Redondo Beach, Calif.

[73] Assignee: Rockwell International Corporation, El Segundo, Calif.

[21] Appl. No.: 488,225

[22] Filed: Apr. 25, 1983

[51] Int. Cl.[4] ...................... H01L 21/66; G01R 27/02
[52] U.S. Cl. ...................................... 324/65 R; 29/574
[58] Field of Search ..................... 340/370.38; 29/574; 324/65 R, 62

[56] References Cited

U.S. PATENT DOCUMENTS 3,808,527 4/1974 Thomas ................................. 29/574
4,386,459 6/1983 Boulin ................................... 29/574

Primary Examiner—Stanley T. Krawczewicz
Assistant Examiner—Jose M. Solis
Attorney, Agent, or Firm—H. Fredrick Hamann; Daniel R. McGlynn

[57] ABSTRACT

A method of quantitatively measuring the relative alignment of elements on a surface of a semiconductor body formed by two sequential masking steps during processing is provided. A fixed pattern of rectangular images are formed on a first mask; and a fixed pattern of repeating U-shaped images are formed on a second mask. The semiconductor body is processed so that the rectangular images on the first mask align with the U-shaped images on the second mask. An electrical probe is applied to opposed ends of the boustrophedaral pattern formed and the electrical resistance measured to determine a parameter related to the relative alignment of elements on the semiconductor body.

9 Claims, 5 Drawing Figures

MASK ALIGNMENT MEASUREMENT STRUCTURE FOR SEMICONDUCTOR FABRICATION

BACKGROUND OF THE INVENTION

1. Field of the Invention

The invention relates to semiconductor fabrication, and in particular the design of a mask alignment test structure for electrically measuring the alignment of superimposed elements on the surface of a semiconductor integrated circuit after processing.

2. Description of the Prior Art

Most semiconductor devices are now made by photolithographic techniques. Such techniques involve the exposure of the surface of a semiconductor body to a particular pattern, and the subsequent formation or development of that pattern into permanent form through the use of wet or dry etching techniques that create various regions and structures on the surface of the semiconductor body. As is well known in the art, photolithographic procedures require that masks be used to define those portions of the semiconductor material where various elements of semiconductor devices are to be located. Because different parts or elements of these semiconductor devices must be located at precisely defined distances from one another, it is desirable that each of the masks be used in forming the semiconductor devices be aligned with respect to one another as precisely as possible both in vertical and horizontal directions.

These operations of alignment and determining the extent of processing are done visually by an operation examining the surface of the semiconductor wafer and the mask under a microscope. The use of marks on the mask and on the wafer are known to facilitate the monitor or measure the misalignment. However, prior to the present invention, this visual measurement procedure is very time consuming and depends on the human errors. Also, a large number of measurements across the wafer as from wafer to wafer are very difficult. In large scale production processes it is also desirable to obtain a statistical base of information on the quantity and relative alignment of elements across the wafer for a large number of processed wafers.

SUMMARY OF THE INVENTION

Briefly and in general terms, the invention provides an electrical method for monitoring the alignment of contacts and N+ diffusion or polysilicon defined in the fabrication of semiconductor circuits by photolithography. In particular, the present invention provides a fixed pattern of images on the surface of the semiconductor wafer and electrode pads at opposed ends of the pattern of images. The electrical resistance between the pads in an accurately aligned pattern is designed to be equal. However, if the surface of the semiconductor body as processed in a manner known in the art (such as by photolithographic exposure and development) results in misalignment, the electrical resistance between pads after the wafer has been processed will be different. An operator or tester can measure the difference in resistance between pads after the wafer has been processed in order to determine the extent of the deviation in alignment of the elements as a consequence of the preceding processing steps.

The novel features which are considered as characteristic for the invention are set forth in particular in the appended claims. The invention itself, however, both as to its construction and its method of operation, together with additional objects and advantages thereof will be best understood from the following description of specific embodiments when read in connection with the accompanying drawings.

DESCRIPTION OF THE PREFERRED EMBODIMENTS

Figure 1:
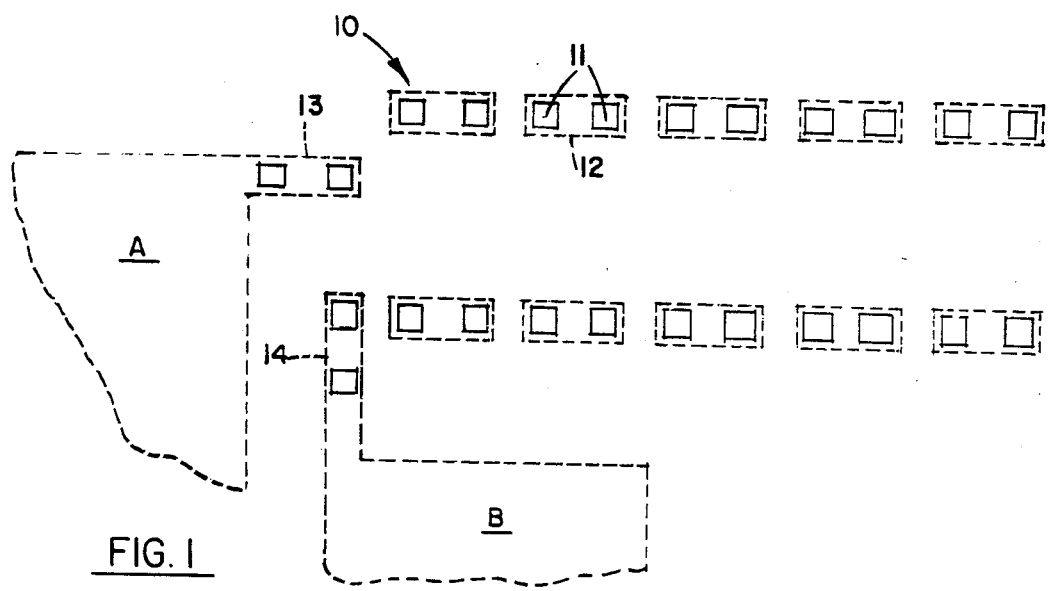
FIG. 1 is an illustration of a portion of a pattern of images on a contact mask (solid lines) and the metal mask (dashed lines) used in a semiconductor fabrication process according to the present invention.

The mask alignment measurement pattern according to the present invention which is intended to be formed on the surface of a semiconductor wafer is illustrated in the Figures. FIG. 1 shows a top, highly magnified view of a superimposition of a portion of a first mask (or contact mast) and third mask (or metal mask) which consists of a pattern of images that form a pattern 10. In the preferred embodiment of FIG. 1 the pattern 10 is represented by square shaped images 11 of which are spaced equidistant from one another is on a third straight line. The rectangularly shaped images 12 (shown as dashed lines) layer formed by the third mask used for interconnection purpose. In the preferred embodiment of FIG. 1, the square images form a contact mask for the formation of what is known as the contact layer to be formed on the surface of semiconductor body or wafer. The two large pad areas, A and B respectively, are formed by the metal mask and are connected to rectangularly shaped images, 13 and 14 respectively, also formed by the metal mask. The rectangular images 12 overlay the square images 11 so that electrical contact is made with the contact areas 11 on the surface of the semiconductor body after fabrication. The pad areas, A and B, function to form a metal contact pad on the surface of the semiconductor body or wafer in order to enable an external electrical conductor or probe to be applied to the pads in order to make electrical measurements on the surface of the wafer.

Figure 2:
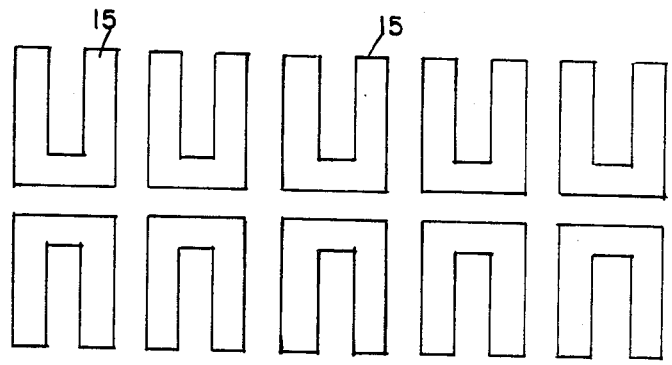
FIG. 2 is an illustration of a portion of a pattern of images on an N+ or polysilicon mask used in a semiconductor fabrication process according to the present invention.

FIG. 2 shows a top highly magnified view of a portion of a second mask which consists of a pattern of U-shaped images 15. In the preferred embodiment of FIG. 2, the pattern consists of identical U-shaped images 15 spaced equidistant from one another and aligned in two parallel straight lines, 20 and 21. In the preferred embodiment of FIG. 2, the U-shaped images form a mask for the N+ diffusion layer in a semiconductor body, or the polysilicon layer of the semiconductor body. In processing of the semiconductor wafer according to the present invention, the second mask including the image represented in FIG. 2 is used prior to the use of the first mask, and thus in use the first mask is aligned to patterns on the wafer formed by the second mask. It is the misalignment between these two masks that is intended to be electrically measured by the present invention. The exact number of U-shaped images 15 can vary depending upon specific processing requirements, and the images shown in FIG. 1 represent only a portion of the entire pattern actually implemented on the second mask. The third mask will then be used to pattern a metal layer to form the interconnection for all the U-shaped patterned elements formed on the N+ or polysilicon layers physically on the semiconductor wafer. It is noted that the metal layer will be touching and making electrical connection with the N+ or polysilicon layers through the square contact window 11.

The images shown in FIGS. 1 and 2 are defined on a mask used in any one of a number of photolithographic processes for processing a semiconductor wafer, and the images are subsequently imprinted on the surface of the wafer itself in one form or another. As an example, the configuration shown in FIG. 2 may be used to expose a photoresist pattern on the surface of the semiconductor wafer. The resulting pattern of images will then be transferred to the actual surface of the semiconductor body, where a N+ diffusion region will be defined according to the pattern.

Figure 3:
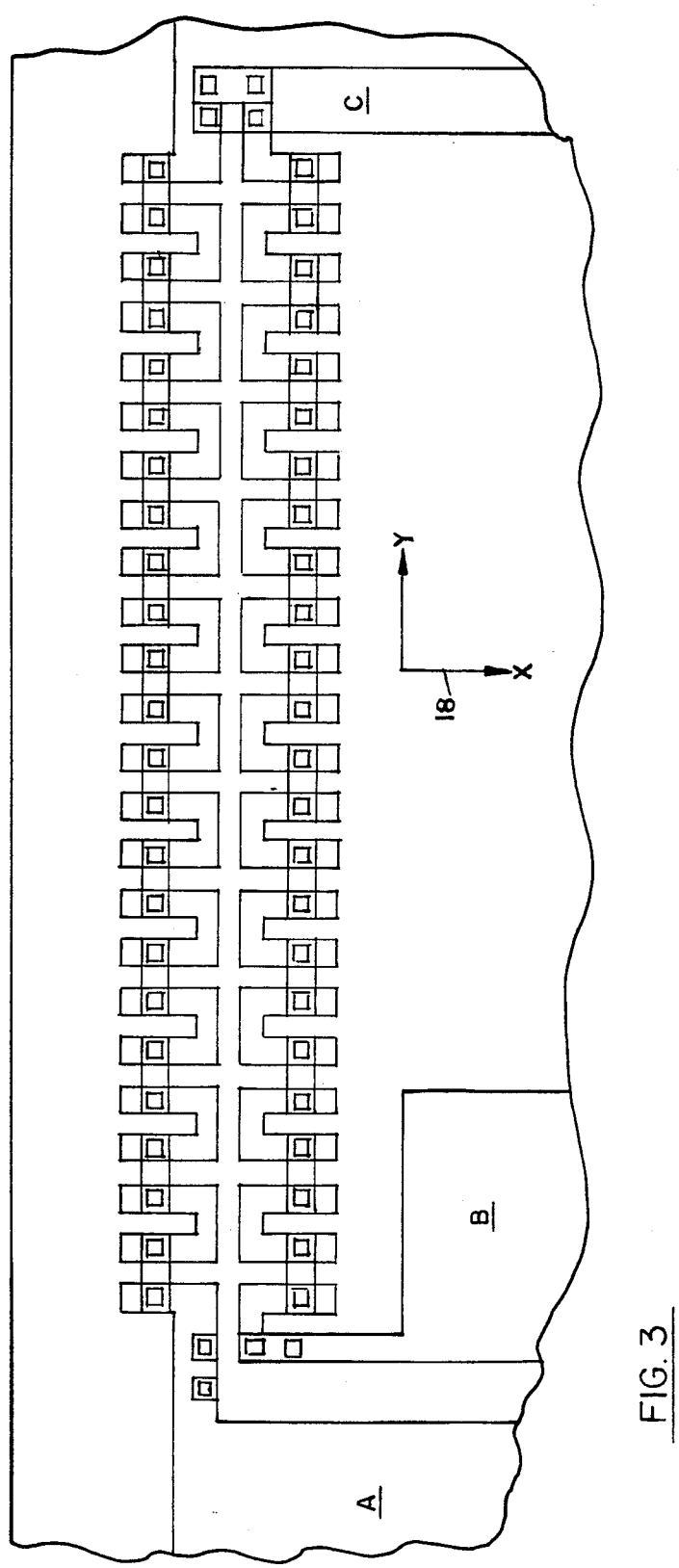
FIG. 3 is an illustration of the top view of a semiconductor device which is exposed and processed using both of the masks in FIGS. 1 and 2, respectively, in which the specific fabrication process has resulted in substantially perfect alignment of the masks together with an interconnection mask.

In particular, after exposure or processing, the pattern on the surface of the semiconductor wafer may appear as shown in FIG. 3, if the images 10 (contact layer) and images 15 (N+ or poly silicon layer) are perfectly aligned. An additional layer is required for interconnection of the square apertures 11 in pattern 10 and the U-shaped images in pattern 15. In the preferred embodiment of FIG. 3, the rectangular images 10 forms the third mask for the metal layer commonly used for interconnection of devices on the surface of the semiconductor wafer. The interconnection of the U-shaped images 15 by the contact layer images 10 results in a meandering or boustrophederal conductive path being established on the surface of the semiconductor device. What is formed is actually a resistor whose resistance is a function of the length of the path. The length of the path is governed by the location of the images 10 with respect to the location of the images 15. In the measurement technique according to the present invention, a resistance measurement is made between pads A and C, and between pads C and B. Since the number of U-shaped elements or images 15 between pads A and C is identical with the number of U-shaped elements between pads C and B, when the images 10 are located in the same portions of the images 15 on both arrays of images 15 the length of the electrical paths between pads A and C are intended to be identical with the path between B and C. In such a situation of perfect alignment the same resistance will be measured between pads A and C as between B and C.

Figure 4:
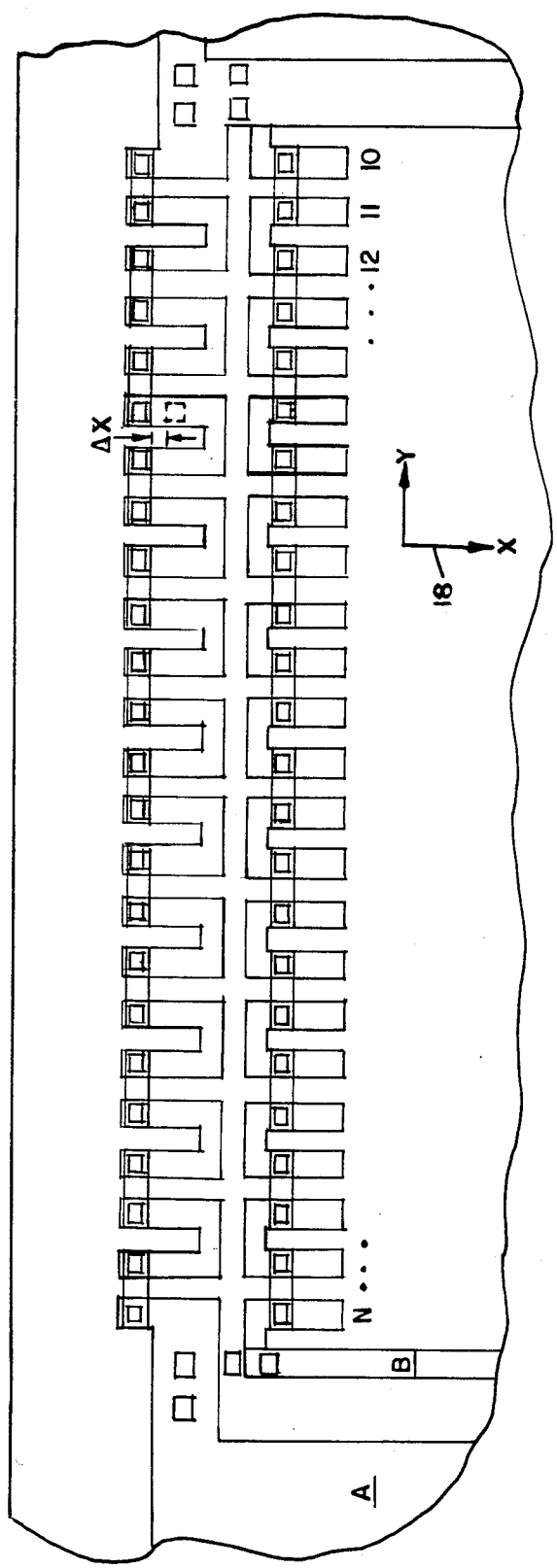
FIG. 4 is an illustration of a top surface view of a semiconductor structure fabricated using both of the masks illustrated in FIGS. 1 and 2, respectively, in which the specific fabrication process has resulted in a misalignment of masks 1 and 2 with respect to the semiconductor wafer, which results in a misaligned pattern being imprinted on the wafer as illustrated in the figure.

If the first and second masks are misaligned during processing, the resulting pattern on the surface of the semiconductor wafer after processing may appear as shown in FIG. 4. Reference may be made to the arbitrary X and Y axis shown by the representation 18 in FIGS. 3 and 4. The misalignment during processing in the configuration shown in FIG. 4 is assumed to be a displacement solely along the X axis for the purpose of simplifying the discussion of the measurements according to the present invention.

In FIG. 4, a larger resistance value will be measured between pads A to C than between B to C since the effective length of each of the U-shaped arms between pad A to C is longer than that of between B to C by $\Delta X$. This $\Delta X$ is the misalignment incurred between the first and second masks during processing. The value of $\Delta X$ can be obtained from the two difference resistance readings between pads A and C (which we call $R_{AC}$) and between pad B and C (which we call $R_{BC}$).

$$\Delta X = (R_{AC} - R_{BC})/4\ Nr$$

where r is the sheet resistance (resistance per unit square) of the N+ or poly silicon layers, and N is an integer representing the total number of U-shaped images between B and C (or between A and C). Such a resistance measurement can be easily implemented with an automatic tester with computer controlled probe stations to probe the pads A,B,C, as is known to those skilled in the art. Therefore, the misalignment $\Delta X$ of the two masks on the entire wafer can be conveniently obtained.

Figure 5:
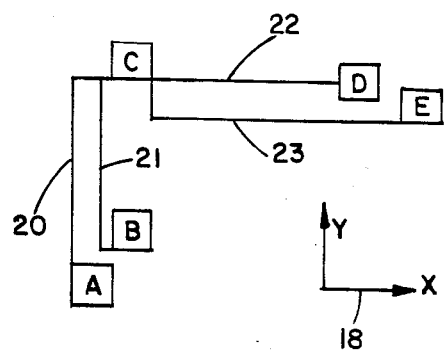
FIG. 5 is an illustration of a highly schematic top surface view of horizontal and vertical mask alignment structures.

In actual processing misalignment does not take place solely along one access. In order to be able to accurately determine the misalignment in any direction it is necessary to have both horizontal and vertical mas alignment measurement structures. FIG. 5 illustrates in highly simplified diagramatic form such a configuration according to the present invention. The previously discussed pattern of U-shaped images along lines 20 and 21 in the Y direction are shown, along with the pads A, B, and C. In addition a second pair of U-shaped images are aligned into corresponding parallel straight lines 22 and 23 which are disposed perpendicular to the first pair, 20 and 21, respectively. The lines 22 and 23 may have one end connected to the pad C and the opposed ends connected to pads D and E respectively. Resistance measurements are then made between pads C and D, and C and E, and a comparison of the resulting resistance measurements to ascertain a misalignment in the Y direction, which we call $\Delta y$.

If the same patterns are used in both horizontal (x) and vertical (y) directions on the first and second masks, the direction and absolute magnitude of the misalignment between the masks can be calculated as O = misalignment angle from horizontal line
O = arctan ($\Delta y/\Delta x$)

$$L = ((\Delta x)^2 + (\Delta y)^2)^{\frac{1}{2}}$$

Such measurements establish a quantitative representation of the relative alignment of elements formed by successive masking steps on the surface of a semiconductor body.

It will be obvious to those skilled in the art that the semiconductor process according to the present invention can be implemented with various semiconductor technologies and different combinations of known process steps, and that the preferred embodiments illustrated here are merely exemplary. The definition of the layers and masks, the relationship of the various zones and regions, and in particular the configuration and distance between the various layers and zones can be chosen depending upon the desired properties. These and other variations can be further elaborated by those skilled in the art without departing from the scope of the present invention.

The present invention is also not restricted to semiconductor materials or circuits. For example, it may be pointed out that photolithographic fabrication is also applicable to magnetic bubble domain devices, Josephson devices, and optoelectronic devices as well.

Without further analysis, the foregoing will so fully reveal the gist of the present invention that others can, by applying current knowledge, readily adapt it for various applications without omitting features that, from the standpoint of prior art, fairly constitutes essential characteristics of the generic or specific aspects of this invention, and, therefore, such adaptations should and are intended to be comprehended within the meaning and range of equivalence of the following claims.

What is claimed is:

1. A method of quantitatively measuring the relative alignment of elements on a surface of a semiconductor body formed by two sequential masking steps during processing thereof comprising the steps of:
   providing a fixed pattern of contact images on a first mask;
   providing a fixed pattern of repeating U-shaped images on a second mask;
   processing said semiconductor body in a predetermined manner so that the contact images on said first mask align with the U-shaped images on said second mask so that respective ones of the contact images interconnect two respective adjacent U-shaped images, thereby forming a boustrophederal pattern;
   applying an electrical probe to opposed ends of said boustrophederal pattern; and
   measuring the electrical resistance between the ends of said boustrophederal pattern to determine a parameter related to the relative alignment of elements on said semiconductor body.

2. A method as defined in claim 1, further comprising the step of providing pattern of images including first, second, and third contact pads on a third mask, said step of measuring the electrical resistance comprising measuring tne resistance between said first and said second contact pads on the processed semiconductor body, and said second and said third contact pads, and comparing the resulting resistance measurements.

3. A method as defined in claim 1, wherein said contact images are square shaped.

4. A method as defined in claim 3 wherein each of said repeating U-shaped images are the same size.

5. A method as defined in claim 3, where the length of the side of said square images is less than the width of the arm of said U-shaped images.

6. A method as defined in claim 1 wherein substantially each of said images in said fixed pattern of contact images are equally spaced from one another.

7. A method as defined in claim 1 wherein said fixed pattern of contact images are formed in two parallel straight lines, the contact images in each of said lines being spaced equidistant from one another.

8. A method as defined in claim 1 wherein said fixed pattern of repeating U-shaped images comprises a first straight line of identical U-shaped images in which each of said U-shaped images are oriented in a first direction, and a second straight line of U-shaped images in which each of said U-shaped images are oriented in a second direction, the first direction of orientation of said U-shaped images being a rotation of 180° with respect to the center of said U-shaped images.

9. A method as defined in claim 1 wherein four resistive patterns are formed, first and second patterns extending in a first direction parallel to one another and third and fourth patterns extending in a second direction substantially perpendicular to said first direction.

* * * * *